(12) United States Patent
Luo

(10) Patent No.: US 12,349,270 B2
(45) Date of Patent: Jul. 1, 2025

(54) CURVED SCREEN BENDING DEVICE AND CURVED SCREEN BENDING METHOD

(71) Applicant: BOE Technology Group Co., Ltd., Beijing (CN)

(72) Inventor: Xiaofei Luo, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 97 days.

(21) Appl. No.: 17/914,644

(22) PCT Filed: Nov. 9, 2021

(86) PCT No.: PCT/CN2021/129590
§ 371 (c)(1),
(2) Date: Sep. 26, 2022

(87) PCT Pub. No.: WO2022/217905
PCT Pub. Date: Oct. 20, 2022

(65) Prior Publication Data
US 2024/0224418 A1 Jul. 4, 2024

(30) Foreign Application Priority Data
Apr. 14, 2021 (CN) .......................... 202110399772.7

(51) Int. Cl.
*H05K 1/02* (2006.01)
*H05K 1/18* (2006.01)

(52) U.S. Cl.
CPC ............. *H05K 1/028* (2013.01); *H05K 1/189* (2013.01)

(58) Field of Classification Search
CPC ................................. H05K 1/028; H05K 1/189
(Continued)

(56) References Cited

U.S. PATENT DOCUMENTS 10,229,963 B1 * 3/2019 Qi ..................... G02F 1/13452
2013/0002583 A1 1/2013 Jin et al.
(Continued)

FOREIGN PATENT DOCUMENTS

CN 105160999 A 12/2015
CN 102855822 B 9/2016
(Continued)

OTHER PUBLICATIONS

PCT/CN2021/129590 international search report and written opinion.
CN 202110399772.7 first office action.

*Primary Examiner* — Binh B Tran
(74) *Attorney, Agent, or Firm* — IPro, PLLC

(57) ABSTRACT

Provided are a curved screen bending device and a curved screen bending method. A to-be-bent screen includes a planar area, a bending area connected to an edge of the planar area, and a flexible printed circuit connected to the bending area. The device includes: a screen bearing platform including a planar first bearing surface; a circuit board bearing platform movable relative to the screen bearing platform and located on an outer side of the screen bearing platform; and a supporting and protecting structure which is arranged on the screen bearing platform and includes first and second side faces opposite to each other, the first side face fits with the first bearing surface, the second side face bears and fixes the to-be-bent screen and at least includes a curved bearing region having a same curvature as that of a curved surface of the bending area after bending.

20 Claims, 2 Drawing Sheets

(58) Field of Classification Search
USPC .......................................................... 361/749
See application file for complete search history.

(56) References Cited

U.S. PATENT DOCUMENTS

| | | |
|---|---|---|
| 2013/0081756 A1 | 4/2013 | Franklin et al. |
| 2016/0360625 A1* | 12/2016 | Ogasawara ......... G02F 1/13452 |
| 2017/0374750 A1 | 12/2017 | Sun |
| 2021/0376280 A1 | 12/2021 | Yang et al. |

FOREIGN PATENT DOCUMENTS

| | | |
|---|---|---|
| CN | 109243308 A | 1/2019 |
| CN | 109712530 A | 5/2019 |
| CN | 110491926 A | 11/2019 |
| CN | 112116879 A | 12/2020 |
| CN | 112270890 A | 1/2021 |
| CN | 112634765 A | 4/2021 |
| CN | 112959804 A | 6/2021 |
| CN | 216268091 U | 4/2022 |
| KR | 20120038213 A | 4/2012 |

* cited by examiner

CURVED SCREEN BENDING DEVICE AND CURVED SCREEN BENDING METHOD

CROSS-REFERENCE TO RELATED APPLICATIONS

This application is the U.S. national phase of PCT Application No. PCT/CN2021/129590 filed on Nov. 9, 2021, which claims priority to Chinese Patent Application No. 202110399772.7 filed in China on Apr. 14, 2021, the disclosures of which are hereby incorporated by reference in their entireties.

TECHNICAL FIELD

The present disclosure relates to the field of display technology, and more particularly, to a curved screen bending device and a curved screen bending method.

BACKGROUND

With the popularity of full-screen mobile phones, foldable display products are evolving to have a small radius. At present, the bending radius of a foldable display can be as small as 3-5 mm. In order to provide an appealing display effect, the edge of a display module (MDL) should also be simultaneously bent into a 3D profile, that is, the display screen needs to be subjected to pad bending to obtain a curved edge. Due to the presence of curved edges, when the screen is placed on a bending device, reverse bending of the back film may occur at the edge of the screen connected to the flexible printed circuit (FPC), resulting in the risk of cracks of metal wire near the bending area.

SUMMARY

Some embodiments of the present disclosure provides a curved screen bending device for bending a to-be-bent screen, where the to-be-bent screen includes a planar area, a bending area connected to an edge of the planar area, and a flexible printed circuit connected to the bending area, and is bent to obtain a curved screen; the curved screen bending device includes:
  a screen bearing platform, wherein the screen bearing platform includes a first bearing surface which is planar;
  a circuit board bearing platform movable relative to the screen bearing platform, wherein the circuit board bearing platform includes a second bearing surface, and the circuit board bearing platform is located on an outer side of the screen bearing platform; and
  a supporting and protecting structure, wherein the supporting and protecting structure is arranged on the screen bearing platform, the supporting and protecting structure includes a first side face and a second side face which are opposite to each other, the first side face fits with the first bearing surface, the second side face is used for bearing and fixing the to-be-bent screen, and the second side face at least includes a curved bearing region, and the curved bearing region has a same curvature as that of a curved surface of the bending area after bending.

Optionally, the curved bearing region includes a first portion for supporting the bending area and a second portion for supporting the flexible printed circuit.

Optionally, a binding structure is provided between the bending area and the flexible printed circuit; and the second side face is provided with an avoidance cavity at a position corresponding to the binding structure.

Optionally, the supporting and protecting structure is made of a resin material.

Optionally, the supporting and protecting structure is made of a polyvinyl chloride material.

Optionally, the second side face is provided with an adhesive for detachably adhering to the to-be-bent screen.

Optionally, the adhesive includes a release adhesive.

Optionally, the release adhesive includes at least one of a UV release adhesive or a thermal release adhesive.

Optionally, the second side face further includes a planar bearing region for fitting with the planar area of the to-be-bent screen.

An embodiment of the present disclosure further provides a curved screen bending method for bending the to-be-bent screen by using the curved screen bending device as described above; the method includes:
  controlling the circuit board bearing platform and the screen bearing platform to move relative to each other, so that the second bearing surface of the circuit board bearing platform and the first bearing surface of the screen bearing platform form a predetermined angle;
  placing the to-be-bent screen on the screen bearing platform, wherein the bending area of the to-be-bent screen is supported and fixed by the second side face of the supporting and protecting structure, and the flexible printed circuit is supported and fixed by the circuit board bearing platform; and
  controlling the circuit board bearing platform and the screen bearing platform to move relative to each other to bend the bending area.

Optionally, the second side face further includes a planar bearing region for fitting with the planar area of the to-be-bent screen;
  wherein, the placing the to-be-bent screen on the screen bearing platform includes:
  supporting and adhesively fixing the planar area of the to-be-bent screen by using the planar bearing region, and supporting and adhesively fixing the bending area of the to-be-bent screen by using the curved bearing region.

Optionally, the second side face is provided with an adhesive for detachably adhering to the to-be-bent screen, and the adhesive includes a release adhesive:
  the method further includes:
  during the bending and after the bending is completed, separating the to-be-bent screen from the supporting and protecting structure by using UV irradiation adhesion reduction or thermal adhesion reduction.

DETAILED DESCRIPTION

In order that the objects, technical solutions and advantages of the embodiments of the present disclosure will become more apparent, a more particular description of the embodiments of the present disclosure will be rendered by reference to the appended drawings. It is to be understood that the described embodiments are part, but not all, of the disclosed embodiments. Based on the embodiments described in the present disclosure, all other embodiments obtained by a person of ordinary skill in the art without inventive effort fall within the scope of the present disclosure.

Unless defined otherwise, technical or scientific terms used in this disclosure shall have the ordinary meaning as understood by one of ordinary skill in the art to which this disclosure belongs. The terms "first", "second", and the like as used herein do not denote any order, quantity, or importance, but rather are used to distinguish one element from another. Likewise, terms such as "a", "an", or "the" do not denote a quantitative limitation, but rather denote the presence of at least one of the referenced item. The term "comprise", "include" or the like means that an element or item preceding the term encompasses elements or items listed after the term and equivalents thereof, and does not exclude other elements or items. The terms "connecting" or "connected" and the like are not limited to physical or mechanical connections, but may include electrical connections, whether direct or indirect. The terms "upper", "lower", "left", "right" and the like are used only to indicate relative positional relationships that may change accordingly when the absolute position of the object being described changes.

Before describing in detail the curved screen bending device and the curved screen bending method provided by the embodiments of the present disclosure, it is necessary to describe the following related art.

Figure 1:
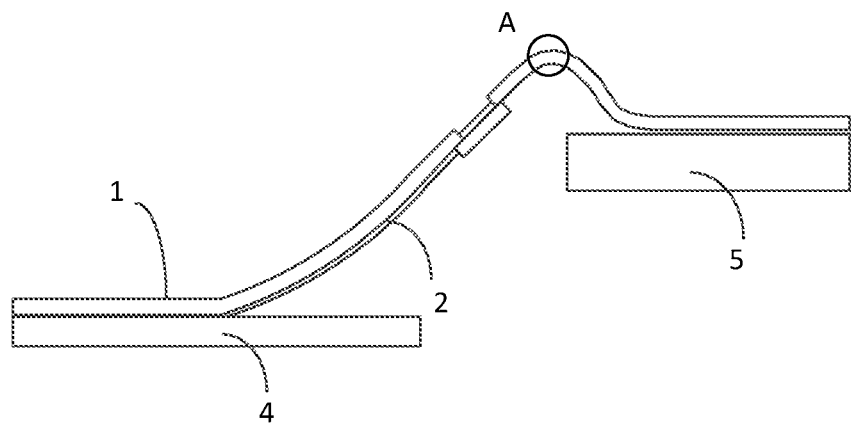
FIG. 1 is a schematic structural diagram showing reverse bending of the back film during bending of a flexible display module in the related art.

As shown in FIG. 1, in the related art, a curved screen module generally includes a flexible panel 1 and a cover plate 2. The edge of the curved screen module is in a folded-out shape. The material of the cover plate 2 of the flexible module is repeatedly bendable, and cannot provide support. Therefore, a curved SUS (stainless steel plate) is used on the inner side of the back film of the flexible panel 1 to fix the shape of the 3D curved surface of the edge. When a curved screen is being bent, the back film on the FPC side (the side where the flexible printed circuit is located) will bend by 180° and attach to the curved SUS, forming a semi-circular arch at the edge of the curved surface.

In the related art, a curved screen bending device includes a screen bearing platform 4 and a circuit board bearing platform 5. However, the screen bearing platform 4 can only bear the planar area of the screen, and the circuit board bearing platform 5 can only bear a flexible printed circuit (FPC). Therefore, as shown in FIG. 1, the bending area of the screen is not supported, and when the screen is placed on a bending device before the screen is bent, reverse bending of the back film on the FPC side will occur, resulting in problem such as cracking of metal wires due to stress concentration in the bending area (Region A in FIG. 1 is a reverse bending part). At the same time, since the screen bearing platform 4 cannot adhere to the edge region of the screen due to the presence of the curved edge of the screen, the edge region tends to shake when bending.

In order to solve the above-mentioned problems, the embodiments of the present disclosure provide a curved screen bending device, which can solve the problem in the related art of cracking of metal wires in the bending area caused by a back film reverse bending phenomenon at the edge of the screen when the screen is bent.

Figure 2:
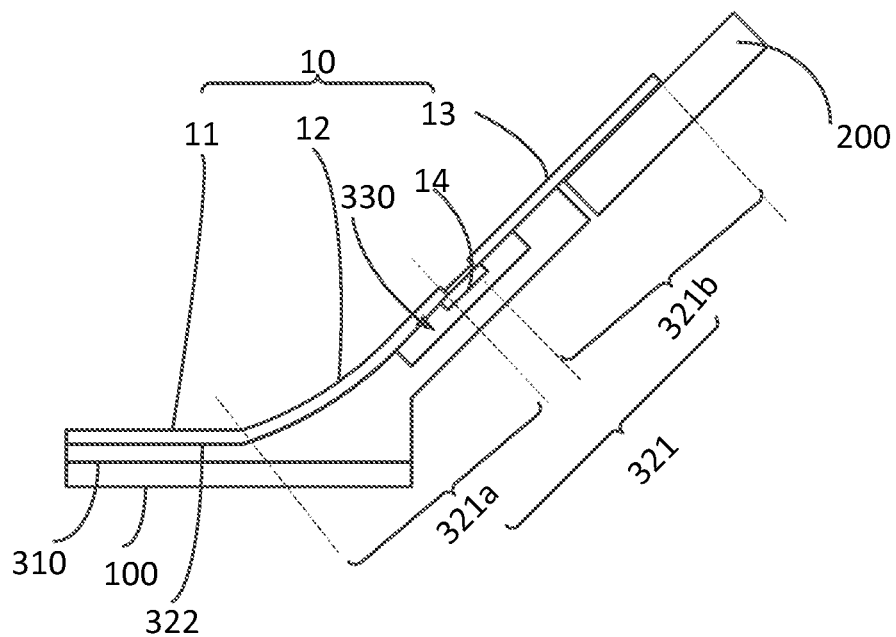
FIG. 2 is a schematic structural diagram showing a to-be-bent screen being bent by using a curved screen bending device provided in an embodiment of the present disclosure.

As shown in FIG. 2, a curved screen bending device according to some embodiments of the present disclosure is used for bending a to-be-bent screen 10. The to-be-bent screen 10 includes a planar area 11, a bending area 12, and a flexible printed circuit 13, where the bending area 12 is connected to the edge of the planar area 11, the flexible printed circuit 13 is connected to the bending area 12, and a curved screen is obtained after the to-be-bent screen 10 is bent.

As shown in FIG. 2, in some embodiments of the present disclosure, the curved screen bending device includes: a screen bearing platform 100, a circuit board bearing platform 200, and a supporting and protecting structure 300, where the screen bearing platform 100 includes a first bearing surface which is planar, and the circuit board bearing platform 200 is movable relative to the screen bearing platform 100; the circuit board bearing platform 200 includes a second bearing surface, and the circuit board bearing platform 200 is located on an outer side of the screen bearing platform 100; the supporting and protecting structure 300 is arranged on the screen bearing platform 100, the supporting and protecting structure 300 includes a first side face 310 and a second side face 320 which are opposite to each other, the first side face 310 fits with the first bearing surface, the second side face 320 is used for bearing and fixing the to-be-bent screen 10, and the second side face 320 at least includes a curved bearing region 321, and the curvature of the curved bearing region 321 is the same as that of a curved surface the bending area 12 after bending.

According to the curved screen bending device and curved screen bending method provided by the embodiments of the present disclosure, a supporting and protecting function is provided for the bending area 12 during the bending of the curved screen by adding the supporting and protecting structure 300 in the bending area 12 at the edge of the to-be-bent screen 10, thereby preventing the risk of reverse bending and wire cracking, and at the same time protecting the bending area 12 from collision during the transportation of the display module after the bending is finished, improving the reliability.

Specifically, in the curved screen bending device provided in the embodiments of the present disclosure, before bending the to-be-bent screen 10, the circuit board bearing platform 200 is moved relative to the screen bearing platform 100, so that the flexible printed circuit 13 is bent to a certain radian position in advance. That is, a predetermined angle between the second bearing surface of the circuit board bearing platform 200 and the first bearing surface of the screen bearing platform 100 is equal to a curved surface angle of the curved screen obtained after bending. Then, the to-be-bent screen 10 is placed on the screen bearing platform 100 and the circuit board bearing platform 200, the flexible printed circuit 13 at the edge of the to-be-bent screen 10 is supported and fixed by the circuit board bearing platform 200, and at least the bending area 12 of the to-be-bent screen 10 is supported and fixed by the supporting and fixing structure. In this way, the bending area 12 of the entire to-be-bent screen 10 is kept in a stable state, thereby ensuring that the screen bearing platform 100 and the circuit board bearing platform 200 fix the to-be-bent screen 10, meanwhile preventing the back film on the side (namely, the FPC side) of the flexible printed circuit 13 of the to-be-bent screen 10 from bending reversely, such that the risk of wire cracking near the bending area 12 is eliminated and the bending process is more stable.

It should be noted that the to-be-bent screen 10 generally includes a display panel 14 and a cover plate 15 fitting to one side of the display panel, and is bent outwards, that is to say, bent toward the side of the display panel facing away from the cover plate. Therefore, during bending, the side of the cover plate 15 of the to-be-bent screen 10 fits with the second side face 320 of the supporting and protecting structure 300, so that the supporting and protecting structure 300 supports and fixes the to-be-bent screen 10.

In some exemplary embodiments, as shown in FIG. 2, the second side face 320 also includes a planar bearing region 322 having the same shape as the planar area 11 of the to-be-bent screen 10.

With the above-mentioned solution, the supporting and protecting structure 300 may be an integral structure provided on the first bearing surface of the screen bearing platform 100, and the second side face 320 may not only include the curved bearing region 321, but also may include the planar bearing region 322, that is to say, the supporting and protecting structure 300 can not only support and protect the bending area 12 of the to-be-bent screen 10, but also can support and protect the planar area 11 of the to-be-bent screen 10. In this way, the supporting and protecting structure 300 can be integrally fixed on the first bearing surface of the screen bearing platform 100, to support and fix the whole to-be-bent screen 10. Therefore, as shown in FIG. 2, the transition between the curved area on the FPC side and the planar area 11 of the to-be-bent screen 10 will be well supported by the supporting and protecting structure 300 and will not easily shake during the bending process.

It will of course be understood that, in practice, the supporting and protecting structure 300 may include only the curved bearing region 321.

Furthermore, in some exemplary embodiments, as shown in FIG. 2, the curved bearing region 321 includes a first portion 321a for supporting the bending area 12 and a second portion 321b for supporting the flexible printed circuit 13. With the above-mentioned solution, since the screen tends to reversely bend at the FPC side, the curved bearing region 321 of the supporting and protecting structure 300 can not only support and protect the bending area 12 of the to-be-bent screen 10, but also support and protect the flexible printed circuit 13, so as to better support and protect the bending position.

Furthermore, in some exemplary embodiments, as shown in FIG. 2, a binding structure 14 is provided between the bending area 12 and the flexible printed circuit 13; and the second side face 320 is provided with an avoidance cavity 330 at a position corresponding to the binding structure 14.

Furthermore, in some exemplary embodiments, the supporting and protecting structure 300 is made of a resin material. For example, the supporting and protecting structure 300 is made of a polyvinyl chloride material.

With the above-mentioned solution, the supporting and protecting structure 300 may be integrally formed of a resin-based material, and compared with a rigid material such as a metal material, the resin-based material is easy to form and has a lower hardness, so that damage to the to-be-bent screen 10 can be avoided.

Furthermore, in some exemplary embodiments, the second side face 320 is provided with an adhesive for detachably adhering to the to-be-bent screen 10. The to-be-bent screen 10 is adhered and fixed by using an adhesive, where the adhesive may be a release adhesive, for example, at least one of a UV release adhesive or a thermal release adhesive. In this way, after the bending is completed and during the complete machine assembly, the supporting and protecting structure 300 can be peeled away from the curved screen by using UV adhesion reduction or thermal adhesion reduction.

Figure 3:
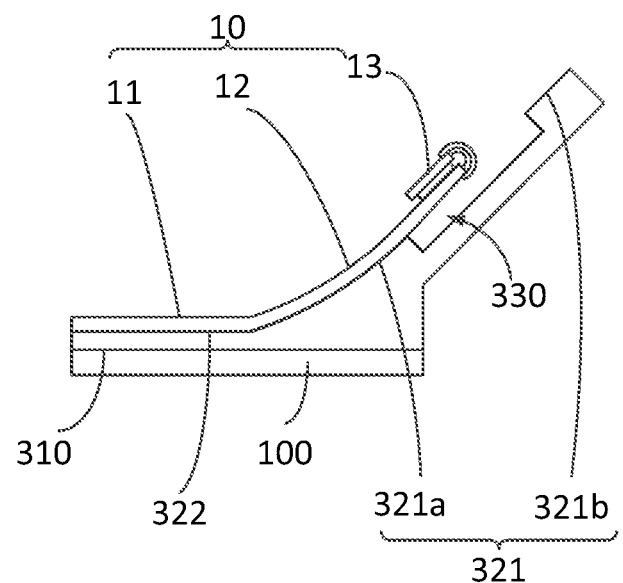
FIG. 3 is a schematic structural diagram showing the to-be-bent screen of which the bending by using the curved screen bending device provided in the embodiment of the present disclosure is completed.

In addition, an embodiment of the present disclosure also provides a curved screen bending method for bending the to-be-bent screen 10 by using the curved screen bending device provided in the embodiments of the present disclosure. The curved screen bending method includes the following steps:

Step S01, the circuit board bearing platform 200 and the screen bearing platform 100 are controlled to move relative to each other, so that a second bearing surface of the circuit board bearing platform and a first bearing surface of the screen bearing platform 100 form a predetermined angle;

Step S02, the to-be-bent screen 10 is placed on the screen bearing platform 100, where the bending area 12 of the to-be-bent screen 10 is supported and fixed by the second side face 320 of the supporting and protecting structure 300, and the flexible printed circuit 13 is supported and fixed by the circuit board bearing platform 200; and Step S03, the circuit board bearing platform 200 and the screen bearing platform 100 are controlled to move relative to each other to bend the bending area 12. The curved screen obtained after bending is shown in FIG. 3.

In the curved screen bending method provided in the embodiments of the present disclosure, before bending the to-be-bent screen 10, the circuit board bearing platform 200 is moved relative to the screen bearing platform 100, so that the flexible printed circuit 13 is bent to a certain radian position in advance. That is, a predetermined angle between the second bearing surface of the circuit board bearing platform 200 and the first bearing surface of the screen bearing platform 100 is equal to a curved surface angle of the curved screen obtained after bending. Then, the to-be-bent screen 10 is placed on the screen bearing platform 100 and the circuit board bearing platform 200, the flexible printed circuit 13 at the edge of the to-be-bent screen 10 is supported and fixed by the circuit board bearing platform 200, and at least the bending area 12 of the to-be-bent screen 10 is supported and fixed by the supporting and fixing structure. In this way, the bending area 12 of the entire to-be-bent screen 10 is kept in a stable state, thereby ensuring that the screen bearing platform 100 and the circuit board bearing platform 200 fix the to-be-bent screen 10, meanwhile preventing the back film on the side (namely, the FPC side) of the flexible printed circuit 13 of the to-be-bent screen 10 from bending reversely, such that the risk of wire cracking near the bending area 12 is eliminated and the bending process is more stable.

In some exemplary embodiments, the second side face 320 also includes a planar bearing region 322, and the planar bearing region 322 has the same shape as the planar area 11 of the to-be-bent screen 10. In the method, the step S02 specifically includes: the planar area 11 of the to-be-bent screen 10 is supported and adhesively fixed by the planar bearing region 322, and the bending area 12 of the to-be-bent screen 10 is supported and adhesively fixed by the curved bearing region 321.

Optionally, the second side face 320 is provided with an adhesive for detachably adhering to the to-be-bent screen 10, and the adhesive includes a release adhesive; the method further includes: during the bending and after the bending is completed, the to-be-bent screen 10 is separated from the supporting and protecting structure 300 by using UV irradiation adhesion reduction or thermal adhesion reduction.

The following points need to be noted.

(1) The drawings relate only to the structures to which the embodiments of the present disclosure relate, and for other structures, references may be made to common designs.

(2) In the drawings used to illustrate embodiments of the present disclosure, the thickness of layers or regions is exaggerated or reduced for clarity, i.e., the drawings are not drawn to scale. It will be understood that when an element such as a layer, film, region or substrate is referred to as being "on" or "under" another element, it can be "directly on" or "directly under" the other element or intervening elements may be present.

(3) Without conflict, embodiments of the present disclosure and features of the embodiments may be combined with each other to provide new embodiments.

The foregoing is directed to particular embodiments of the present disclosure, but the scope of the disclosure is not limited thereto, and the scope of the disclosure is defined by the appended claims.

What is claimed is:

1. A curved screen bending device for bending a to-be-bent screen, wherein the to-be-bent screen comprises a planar area, a bending area connected to an edge of the planar area, and a flexible printed circuit connected to the bending area, and is bent to obtain a curved screen; the curved screen bending device comprises:
    a screen bearing platform, wherein the screen bearing platform comprises a first bearing surface which is planar;
    a circuit board bearing platform movable relative to the screen bearing platform, wherein the circuit board bearing platform comprises a second bearing surface, and the circuit board bearing platform is located on an outer side of the screen bearing platform; and
    a supporting and protecting structure, wherein the supporting and protecting structure is arranged on the screen bearing platform, and comprises a first side face and a second side face which are opposite to each other, the first side face fits with the first bearing surface, the second side face is used for bearing and fixing the to-be-bent screen, and the second side face at least comprises a curved bearing region, and the curved bearing region has a same curvature as that of a curved surface of the bending area after bending.

2. The curved screen bending device according to claim 1, wherein
    the curved bearing region includes a first portion for supporting the bending area and a second portion for supporting the flexible printed circuit.

3. The curved screen bending device according to claim 1, wherein
    a binding structure is provided between the bending area and the flexible printed circuit; the second side face is provided with an avoidance cavity at a position corresponding to the binding structure.

4. The curved screen bending device according to claim 1, wherein
    the supporting and protecting structure is made of a resin material.

5. The curved screen bending device according to claim 4, wherein
    the supporting and protecting structure is made of a polyvinyl chloride material.

6. The curved screen bending device according to claim 1, wherein
    the second side face is provided with an adhesive for detachably adhering to the to-be-bent screen.

7. The curved screen bending device according to claim 6, wherein
    the adhesive comprises a release adhesive.

8. The curved screen bending device according to claim 7, wherein
    the release adhesive comprises at least one of a UV release adhesive or a thermal release adhesive.

9. The curved screen bending device according to claim 1, wherein
    the second side face further comprises a planar bearing region for fitting with the planar area of the to-be-bent screen.

10. A curved screen bending method for bending the to-be-bent screen by using the curved screen bending device according to claim 1, comprising:
    controlling the circuit board bearing platform and the screen bearing platform to move relative to each other, so that the second bearing surface of the circuit board bearing platform and the first bearing surface of the screen bearing platform form a predetermined angle;
    placing the to-be-bent screen on the screen bearing platform, wherein the bending area of the to-be-bent screen is supported and fixed by the second side face of the supporting and protecting structure, and the flexible printed circuit is supported and fixed by the circuit board bearing platform; and
    controlling the circuit board bearing platform and the screen bearing platform to move relative to each other to bend the bending area.

11. The curved screen bending method according to claim 10, wherein
    the second side face further comprises a planar bearing region for fitting with the planar area of the to-be-bent screen;
    wherein, the placing the to-be-bent screen on the screen bearing platform comprises:
    supporting and adhesively fixing the planar area of the to-be-bent screen by using the planar bearing region, and supporting and adhesively fixing the bending area of the to-be-bent screen by using the curved bearing region.

12. The curved screen bending method according to claim 11, wherein
    the second side face is provided with an adhesive for detachably adhering to the to-be-bent screen, and the adhesive comprises a release adhesive;
    the method further comprises:
    during the bending and after the bending is completed, separating the to-be-bent screen from the supporting and protecting structure by using UV irradiation adhesion reduction or thermal adhesion reduction.

13. The curved screen bending device according to claim 9, wherein the planar bearing region has a same shape as the planar area of the to-be-bent screen.

14. The curved screen bending device according to claim 1, wherein the supporting and protecting structure is an integral structure provided on the first bearing surface of the screen bearing platform.

15. The curved screen bending device according to claim 14, wherein the supporting and protecting structure is integrally fixed on the first bearing surface of the screen bearing platform, to support and fix the whole to-be-bent screen.

16. The curved screen bending device according to claim 14, wherein the supporting and protecting structure is integrally formed of a resin-based material.

17. A curved screen bending method for bending the to-be-bent screen by using the curved screen bending device according to claim 2, comprising:
- controlling the circuit board bearing platform and the screen bearing platform to move relative to each other, so that the second bearing surface of the circuit board bearing platform and the first bearing surface of the screen bearing platform form a predetermined angle;
- placing the to-be-bent screen on the screen bearing platform, wherein the bending area of the to-be-bent screen is supported and fixed by the second side face of the supporting and protecting structure, and the flexible printed circuit is supported and fixed by the circuit board bearing platform; and
- controlling the circuit board bearing platform and the screen bearing platform to move relative to each other to bend the bending area.

18. A curved screen bending method for bending the to-be-bent screen by using the curved screen bending device according to claim 3, comprising:
- controlling the circuit board bearing platform and the screen bearing platform to move relative to each other, so that the second bearing surface of the circuit board bearing platform and the first bearing surface of the screen bearing platform form a predetermined angle;
- placing the to-be-bent screen on the screen bearing platform, wherein the bending area of the to-be-bent screen is supported and fixed by the second side face of the supporting and protecting structure, and the flexible printed circuit is supported and fixed by the circuit board bearing platform; and
- controlling the circuit board bearing platform and the screen bearing platform to move relative to each other to bend the bending area.

19. A curved screen bending method for bending the to-be-bent screen by using the curved screen bending device according to claim 4, comprising:
- controlling the circuit board bearing platform and the screen bearing platform to move relative to each other, so that the second bearing surface of the circuit board bearing platform and the first bearing surface of the screen bearing platform form a predetermined angle;
- placing the to-be-bent screen on the screen bearing platform, wherein the bending area of the to-be-bent screen is supported and fixed by the second side face of the supporting and protecting structure, and the flexible printed circuit is supported and fixed by the circuit board bearing platform; and
- controlling the circuit board bearing platform and the screen bearing platform to move relative to each other to bend the bending area.

20. A curved screen bending method for bending the to-be-bent screen by using the curved screen bending device according to claim 6, comprising:
- controlling the circuit board bearing platform and the screen bearing platform to move relative to each other, so that the second bearing surface of the circuit board bearing platform and the first bearing surface of the screen bearing platform form a predetermined angle;
- placing the to-be-bent screen on the screen bearing platform, wherein the bending area of the to-be-bent screen is supported and fixed by the second side face of the supporting and protecting structure, and the flexible printed circuit is supported and fixed by the circuit board bearing platform; and
- controlling the circuit board bearing platform and the screen bearing platform to move relative to each other to bend the bending area.

\* \* \* \* \*